(12) United States Patent
Ishiwata et al.

(10) Patent No.: US 6,605,868 B2
(45) Date of Patent: *Aug. 12, 2003

(54) INSULATING SUBSTRATE INCLUDING MULTILEVEL INSULATIVE CERAMIC LAYERS JOINED WITH AN INTERMEDIATE LAYER

(75) Inventors: Yutaka Ishiwata, Tokyo (JP); Kosoku Nagata, Tokyo (JP); Toshio Shimizu, Tokyo (JP); Hiroyuki Hiramoto, Tokyo (JP); Yasuhiko Taniguchi, Tokyo (JP); Kouji Araki, Tokyo (JP); Hiroshi Fukuyoshi, Tokyo (JP); Hiroshi Komorita, Tokyo (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/457,335

(22) Filed: Dec. 9, 1999

(65) Prior Publication Data

US 2002/0066953 A1 Jun. 6, 2002

(30) Foreign Application Priority Data

Dec. 10, 1998 (JP) ............................................. 10-351596

(51) Int. Cl.[7] ............................. H05K 3/46; H05K 1/03; H01L 23/02; H01L 23/48; B32B 5/16

(52) U.S. Cl. ..................... 257/703; 257/701; 257/700; 257/758; 257/468; 257/731; 257/762; 257/712; 257/713; 257/723; 257/485; 29/827; 29/852; 29/830; 174/52.4

(58) Field of Search ................................ 257/678, 700, 257/701, 702, 703, 758, 762, 773, 723, 712, 713, 787, 788, 796, 731, 668, 685; 29/827, 852, 830; 174/52.4

(56) References Cited

U.S. PATENT DOCUMENTS

| 4,221,047 A | * | 9/1980 | Narken et al. | 29/840 |
| 4,277,528 A | * | 7/1981 | Doi et al. | 428/192 |
| 4,849,284 A | * | 7/1989 | Arthur et al. | 428/325 |
| 5,388,328 A | * | 2/1995 | Yokono et al. | 29/852 |

(List continued on next page.)

FOREIGN PATENT DOCUMENTS

| JP | 58-102532 | * | 6/1983 | 257/703 |
| JP | 3-232242 | * | 10/1991 | |
| JP | 5-167006 | | 7/1993 | |
| JP | 7-52431 | * | 2/1995 | |
| JP | 9-121004 | | 5/1997 | |
| JP | 10-093244 | | 4/1998 | |
| JP | 10-218360 | * | 8/1998 | |

*Primary Examiner*—Alexander O. Williams
(74) *Attorney, Agent, or Firm*—Oblon, Spivak, McClelland, Maier & Neustadt, P.C.

(57) ABSTRACT

An insulating substrate (1) has insulative ceramic layers (2, 3) laid one upon another, an intermediate layer (4) made of a material that is different from a material of the ceramic layers and arranged between adjacent ones of the ceramic layers to join the adjacent ceramic layers to each other, a first conductive layer (5) joined to the top surface of a top one of the ceramic layers, and a second conductive layer (6) joined to the bottom surface of a bottom one of the ceramic layers. Even if any one of the ceramic layers has strength lower than design strength and causes a breakage due to, for example, thermal stress, the remaining ceramic layers are sound to secure a specified breakdown voltage for the insulating substrate.

18 Claims, 12 Drawing Sheets

U.S. PATENT DOCUMENTS

| | | | |
|---|---|---|---|
| 5,521,332 A | * 5/1996 | Shikata et al. | 257/700 |
| 5,621,243 A | * 4/1997 | Baba et al. | 259/712 |
| 5,681,402 A | * 10/1997 | Ichinose et al. | 257/753 |
| 5,703,397 A | * 12/1997 | Endo et al. | 257/701 |
| 5,747,875 A | * 5/1998 | Oshima | 257/687 |
| 5,769,989 A | * 6/1998 | Hoffmeyer et al. | 438/118 |
| 5,880,705 A | * 3/1999 | Onyskevych et al. | 345/80 |
| 5,907,187 A | * 5/1999 | Koiwa et al. | 257/737 |
| 5,920,142 A | * 7/1999 | Ohishi et al. | 310/313 R |
| 6,014,314 A | * 1/2000 | Mikubo | 361/704 |
| 6,087,682 A | * 7/2000 | Ando | 257/178 |
| 6,139,666 A | * 10/2000 | Fasano et al. | 156/85 |
| 6,190,834 B1 | * 2/2001 | Narahara et al. | 430/284.1 |

* cited by examiner

FIG.3

| NUMBER OF INSULATIVE CERAMIC LAYERS | NUMBER OF TEST PIECES | ΔT(°C) | | | | | |
|---|---|---|---|---|---|---|---|
| | | 100 | 125 | 150 | 175 | 200 |
| 2(PRESENT INVENTION) | 100 | 0/100 | 0/100 | 0/100 | 0/100 | 1/100 |
| 3(PRESENT INVENTION) | 100 | 0/100 | 0/100 | 0/100 | 0/100 | 0/100 |
| 1(PRIOR ART) | 100 | 0/100 | 2/100 | 5/100 | 9/100 | 17/100 |

FIG.4

| MATERIAL | METAL OXIDE | | | |
|---|---|---|---|---|
| | $Al_2O_3$ | $SiO_2$ | $ZrO_2$ | $ZrO_2 \cdot SiO_2$ |
| SPECIFIC RESISTANCE($\Omega \cdot m$) | $>10^{12}$ | $8 \times 10^{11}$ | $10^4$ | $4 \times 10^7$ |
| THERMAL CONDUCTIVITY(W/m·K) | 30 | 1 | 2 | 6 |

| MATERIAL | METAL NITRIDE | | |
|---|---|---|---|
| | BN | $Si_3N_4$ | AlN |
| SPECIFIC RESISTANCE($\Omega \cdot m$) | $>10^{12}$ | $>10^{12}$ | $>10^{12}$ |
| THERMAL CONDUCTIVITY(W/m·K) | 20 | 30 | 170 |

| MATERIAL | METAL CARBIDE | | |
|---|---|---|---|
| | SiC | TiC | WC | ZrC |
| SPECIFIC RESISTANCE($\Omega \cdot m$) | — | $10^{-4}$ | $2 \times 10^{-4}$ | — |
| THERMAL CONDUCTIVITY(W/m·K) | 125 | 44 | 52 | 25 |

| MATERIAL | METAL BORIDE | | |
|---|---|---|---|
| | $LaB_6$ | $TiB_2$ | $ZrB_2$ |
| SPECIFIC RESISTANCE($\Omega \cdot m$) | $10^{-4}$ | $10^{-4}$ | $7 \times 10^{-5}$ |
| THERMAL CONDUCTIVITY(W/m·K) | — | 38 | 23 |

FIG.5

| MATERIAL OF INTERMEDIATE LAYER | NUMBER OF TEST PIECES | ΔT(°C) | | | | |
|---|---|---|---|---|---|---|
| | | 100 | 125 | 150 | 175 | 200 |
| COPPER | 20 | 0/20 | 0/20 | 0/20 | 0/20 | 0/20 |
| TUNGSTEN | 20 | 0/20 | 0/20 | 0/20 | 1/20 | 3/20 |
| NIOBIUM | 20 | 5/20 | 12/20 | 20/20 | — | — |

RADIUS OF CURVATURE
AT CORNER (d2) (mm)

INSULATING SUBSTRATE INCLUDING MULTILEVEL INSULATIVE CERAMIC LAYERS JOINED WITH AN INTERMEDIATE LAYER

BACKGROUND OF THE INVENTION

1. Field of the Invention

The present invention relates to an insulating substrate composed of insulative ceramic layers having a proper breakdown voltage, a method of manufacturing such an insulating substrate, and a semiconductor device employing the insulating substrate. The present invention also relates to a module semiconductor device such as a power semiconductor device having semiconductor chips to control large current.

2. Description of the Prior Art

Semiconductor chips used to control a small current of several milliamperes to several amperes. Presently, they are able to control a large current of several tens of amperes to about 100 amperes. There are module semiconductor devices that incorporate semiconductor chips in an insulative resin case to control a current of several hundreds of amperes to about 1000 amperes. The module semiconductor devices are widely used as power sources to drive vehicles or large motors in rolling plants and chemical plants.

The module semiconductor devices are capable of not only handing large current but also providing a high breakdown voltage of, for example, 5 kV. In the future, a breakdown voltage of 10 kV or higher will be required. A higher current value means higher heat generation. The module semiconductor devices must efficiently dissipate heat from semiconductor chips, and for this, they must be made of material of high thermal conductivity.

FIG. 1B is a sectional view showing a module semiconductor device 65 according to a prior art. Semiconductor chips 57 are joined to the top surface of an insulating substrate 51 with a solder layer 59. The bottom surface of the insulating substrate 51 is joined to the top surface of a base 60 with a solder layer 61. The base 60 is made of metal or a composite material of metal and ceramics. The semiconductor chips 57, solder layers 59 and 61, and insulating substrate 51 are sealed with insulative sealing resin 63 and are packed in an insulative resin case 64, to form the module semiconductor device 65. A water- or air-cooled heat sink 66 is fixed to the bottom surface of the base 60 with bolts 67.

FIG. 1A shows the insulating substrate 51 of the module semiconductor device 65 of FIG. 1B. The insulating substrate 51 consists of an insulative ceramic layer 52 and conductive layers 55 and 56. The conductive layers 55 and 56 are joined to the top and bottom surfaces of the ceramic layer 52, respectively, by direct bonding copper method or active metal brazing method.

The module semiconductor device 65 of the prior art dissipates heat from the semiconductor chips 57 to the insulating substrate 51, base 60, and heat sink 66. Therefore, the insulating substrate 51, in particular, the conductive layers 55 and 56 must have good thermal conductivity. For this, the conductive layers 55 and 56 are usually made of copper, aluminum, an alloy thereof, or a composite material thereof.

A breakdown voltage of the module semiconductor device 65 is determined by that of the semiconductor chips 57, which is determined by that of the insulating substrate 51. To improve the breakdown voltage of the module semiconductor device 65, it is necessary to improve the breakdown voltage of the insulating substrate 51. Improving the breakdown voltage of the insulating substrate 51 is achievable by thickening the ceramic layer 52. The ceramic layer 52 may be made of aluminum oxide ($Al_2O_3$) or aluminum nitride (AlN) having a good dielectric property.

A module semiconductor device has a layered structure of semiconductor chips and an insulative ceramic layer that have low thermal expansion coefficients, and conductive layers and a base that have high thermal expansion coefficients. When the semiconductor chips are energized, they generate heat to repeatedly apply large thermal stress onto these elements and sometimes crack the ceramic layer to cause a dielectric breakdown.

To cope with this problem, Japanese Unexamined Patent Publication No. 9-275166 forms a layer of refractory metal such as tungsten (W) and molybdenum (Mo) whose thermal expansion coefficients are close to that of an insulative ceramic layer of an insulating substrate, on each of the top and bottom surfaces of the ceramic layer, to relax thermal stress on the ceramic layer and reinforce the same. The refractory metal, however, has lower thermal conductivity than copper and aluminum, and therefore, is not always preferable in terms of cooling semiconductor chips. In addition, the conventional copper and aluminum plastically deform to relax thermal stress on an insulative ceramic layer. On the other hand, the refractory metal has a very high elastic coefficient and yield strength, and therefore, provides no stress relaxing effect. An analysis of thermal stress on refractory metal layers shows that high thermal stress occurs on the refractory metal layers. In addition, the fracture toughness of the refractory metal is not high. Due to these factors, the refractory metal layers have a high possibility of causing cracks due to thermal stress.

Japanese Unexamined Patent Publication Nos. 8-195450 and 8-195458 employ aluminum oxide to form an insulative ceramic layer to prevent cracks. Aluminum oxide may be stronger than aluminum nitride but has lower thermal conductivity than the aluminum nitride. This low thermal conductivity of aluminum oxide may further drop if reinforcing elements are added to aluminum oxide.

Materials used to form insulative ceramic layers generally have low fracture toughness and high crack sensitivity. Even a fine defect on the surface of an insulative ceramic layer may start a crack running across the thickness thereof. The inventors of the present invention studied the details of breaking behavior of insulating substrates through thermal cycles and found that the fracture toughness of insulative ceramic materials is very low compared with that of metal materials, and once a crack occurs on a layer made of an insulative ceramic material, it quickly propagates across the thickness of the layer. The insulative ceramic materials have a breakdown voltage of 10 kV or above per a thickness of 1-mm. However, even a fine crack across the 1-mm thickness deteriorates the breakdown voltage to that of air, i.e., about 3 to 4 kV. This may instantaneously cause a dielectric breakdown of a module semiconductor device that employs the ceramic layer. In high humidity, the breakdown voltage of air further deteriorates to cause a dielectric breakdown at a voltage lower than 3 kV or 4 kV.

If an insulative ceramic layer of 1-mm thick has no cracks running across the thickness thereof, it will maintain a breakdown voltage of 10 kV or higher. It is important, therefore, to prevent cracks on insulative ceramic layers.

Ceramic materials have individual strength values that widely vary from material to material. Accordingly, strength test data for a given ceramic material must statistically be processed with the use of standard deviations and Weibull distributions before determining a stress threshold for the ceramic material. Once the stress threshold is determined, it is used to design a module semiconductor device that employs the ceramic material.

Among many insulative ceramic layers, some may have strength that is below design strength. To prevent a dielectric breakdown of module semiconductor devices that are made from such ceramic layers, it is necessary to completely eliminate cracks from the ceramic layers. To achieve this, design stress for the ceramic layers must be set as small as possible. This, however, is impractical to achieve. In this way, ceramic materials have a reliability problem.

SUMMARY OF THE INVENTION

An object of the present invention is to provide an insulating substrate having a high breakdown voltage to achieve high reliability.

Another object of the present invention is to provide a method of manufacturing an insulating substrate that has a high breakdown voltage and is reliable.

Still another object of the present invention is to provide a module semiconductor device that has a high breakdown voltage and is reliable.

In order to accomplish the objects, a first aspect of the present invention provides an insulating substrate consisting of insulative ceramic layers, an intermediate layer arranged between adjacent ones of the ceramic layers to join them together, a first conductive layer joined to the top surface of a top one of the ceramic layers, and a second conductive layer joined to the bottom surface of a bottom one of the ceramic layers.

The first aspect joins insulative ceramic layers each having a predetermined breakdown voltage to one another with intermediate layers and arranges a first conductive layer on the top surface of a top one of the ceramic layers and a second conductive layer on the bottom surface of a bottom one of the ceramic layers. The intermediate layers are made of a material that is different from a material of the ceramic layers.

Even if any one of the ceramic layers of the substrate has strength lower than a design value to cause a breakage due to thermal stress, the remaining ceramic layers will be sound to cause no dielectric breakdown.

Generally, an insulating substrate has a creepage surface (to be explained alter) having a low breakdown voltage. Accordingly, it is insufficient for an insulative ceramic layer to have a thickness that secures a required breakdown voltage. Namely, the ceramic layer must have a thickness that secures the required breakdown voltage even at a creepage surface. The present invention employs a plurality of insulative ceramic layers to solve this problem without greatly increasing the thickness of an insulating substrate. Manufacturing thin insulative ceramic layers is more productive and cost saving than manufacturing thick insulative ceramic layers. The thin ceramic layers have a reduced volume, which leads to reduce a probability of defects and improve reliability.

To prevent a breakage of an insulating substrate due to thermal stress, etc., the first aspect selects materials for forming the insulating substrate. These materials will be explained. The insulative ceramic layers of the insulating substrate may be made from a material selected from the group consisting of metal oxides and metal nitrides. The intermediate layers of the insulating substrate may be made of a metal whose yield strength is half or below the fracture strength of the material for the insulative ceramic layers, or metal or ceramics whose thermal expansion coefficient is within a range of $\pm 2 \times 10^{-6}$/K of that of the material for the insulative ceramic layers. The first and second conductive layers of the insulating substrate may be made of a material selected from the group consisting of copper, aluminum, and alloys of copper and aluminum. If the insulating substrate consists of three or more insulative ceramic layers, the top and bottom ones of the ceramic layers may be made of a material whose strength and fracture toughness are higher than those of a material for the remaining ceramic layers. The insulating substrate may be produced by joining a copper layer to each of the top and bottom surfaces of each insulative ceramic layer and by joining the copper layers together. The insulative ceramic layers, intermediate layers, and first and second conductive layers are joined together by a method selected from the group consisting of soldering method, active metal brazing method, and direct bonding copper method.

To improve the breakdown voltage of the insulating substrate, the first aspect employs special structures. These will be explained. Each end face of each insulative ceramic layer is protruded from the end faces of the first and second conductive layers and intermediate layers by 0.5 mm or more, preferably, 1.0 mm or more. Each corner of the insulative ceramic layers, first and second conductive layers, and intermediate layers may have a radius of curvature of 0.5 mm or larger, preferably, 1.0 mm or larger. Each edge of the insulative ceramic layers may be chamfered by a size of ⅓ or larger of the thickness of the insulative ceramic layer at an angle in the range of 30 to 60 degrees with respect to a vertical. Preferably, it may be chamfered by a size of ⅓ or larger of the thickness of the insulative ceramic layer at an angle of 45 degrees. A creepage surface of the insulating substrate may be provided with an insulator inserted into a gap between the insulative ceramic layers. An end face of the insulator may be protruded from the end faces of the insulative ceramic layers. The surface of each insulative ceramic layer that is exposed to atmosphere may be covered with an insulator that blocks moisture.

Thermal stress acting on each insulative ceramic layer is calculated from statistical data related to the strength of a material of the insulative ceramic layer. If two insulative ceramic layers are laid one upon another to form an insulating substrate, a probability of the two ceramic layers causing a breakage will be one several tens of thousandths. If higher reliability is required, three insulative ceramic layers may be employed to form an insulating substrate to greatly reduce a probability of causing a breakage.

A second aspect of the present invention provides a method of manufacturing an insulating substrate, including the steps of fixing a plurality of insulative ceramic layers at given intervals in a forging die, pouring molten metal into the forging die, forging and solidifying the molten metal to form each intermediate layer between adjacent ones of the ceramic layers to join them together, a first conductive layer on the top surface of a top one of the ceramic layers, and a second conductive layer on the bottom surface of a bottom one of the ceramic layers, and removing excess parts from the solidified metal to complete the insulating substrate.

The "given intervals" are set to be proper for forming the intermediate layers when the molten metal solidifies. The step of removing excess parts to complete the insulating substrate may be carried out by machining or electrolytic etching.

The second aspect involves no joint layers formed by soldering method or active metal brazing method, and therefore, causes no strength problem and improves the thermal cycle resistance of the insulating substrate. Compared with the direct bonding copper method, the second aspect involves a large quantity of molten metal when forging the insulating substrate. As a result, the second aspect forms little defects such as voids in each joint interface of the insulating substrate.

A third aspect of the present invention provides a method of manufacturing an insulating substrate, including the steps of joining a copper layer to each of the top and bottom surfaces of each insulative ceramic layer and joining the copper layers together.

The third aspect forms each joint interface of an insulating substrate with the same material, i.e., copper, to prevent a warp and gap from being formed at the joint interface, thereby improving the strength of the joint interface.

A fourth aspect of the present invention provides a module semiconductor device having insulative ceramic layers, an intermediate layer arranged between adjacent ones of the ceramic layers to join them together, a first conductive layer joined to the top surface of a top one of the ceramic layers, a second conductive layer joined to the bottom surface of a bottom one of the ceramic layers, semiconductor chips joined to the top surface of the first conductive layer, and a base joined to the bottom surface of the second conductive layer.

Even if the strength of any one of the insulative ceramic layers that form an insulating substrate is below design strength to cause a breakage due to thermal stress, the remaining ceramic layers of the fourth aspect will be sound to maintain a required breakdown voltage for the insulating substrate. The module semiconductor device of the fourth aspect is capable of continuously operating even if one of the ceramic layers causes a breakage.

According to the fourth aspect, a gap between adjacent ones of the ceramic layers along a creepage surface of the insulating substrate and a gap between the bottom ceramic layer and the base may be filled with insulative sealing resin.

BRIEF DESCRIPTION OF THE DRAWINGS

FIG. 3 is a table showing thermal cycle test results including dielectric breakdown ratios with respect to temperature differences ($\Delta$ T) of insulating substrates of the present invention and prior art;

FIG. 4 is a table showing the specific resistance and thermal conductivity of each material used to form an insulative ceramic layer and suggesting proper materials for making insulative ceramic layers according to a second embodiment of the present invention;

FIG. 5 is a table showing thermal cycle test results including dielectric breakdown ratios for copper, tungsten, and niobium and suggesting proper materials for making intermediate layers according to a third embodiment of the present invention;

DETAILED DESCRIPTION OF THE EMBODIMENTS

Figure 1A:
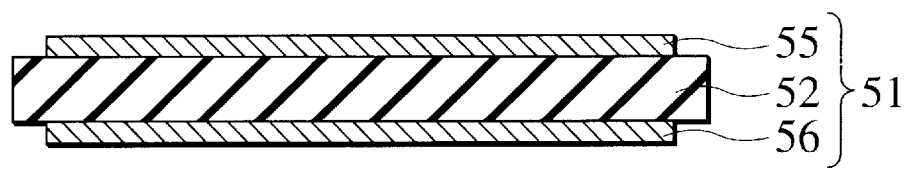
FIG. 1A is a sectional view showing an insulating substrate according to a prior art.
Figure 1B:
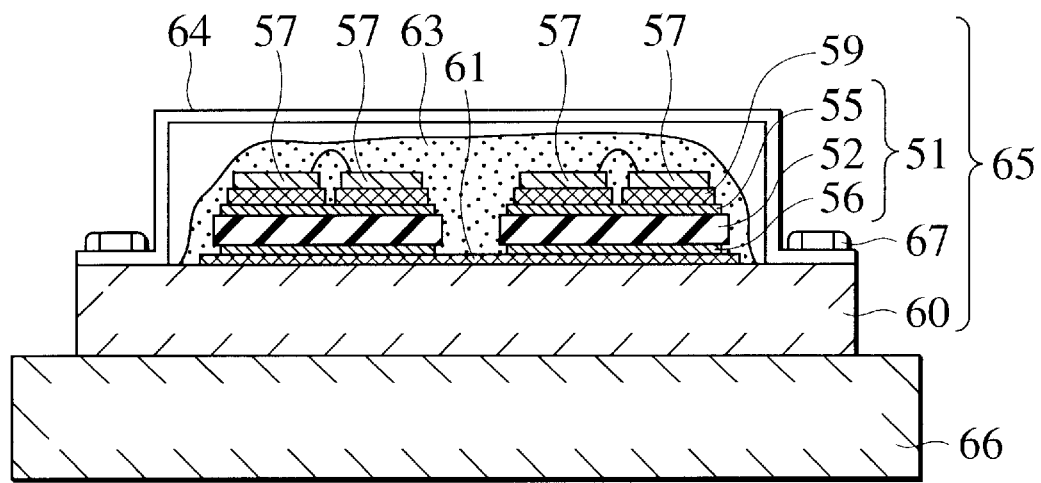
FIG. 1B is a sectional view showing a module semiconductor device according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(First Embodiment)

Figure 2A:
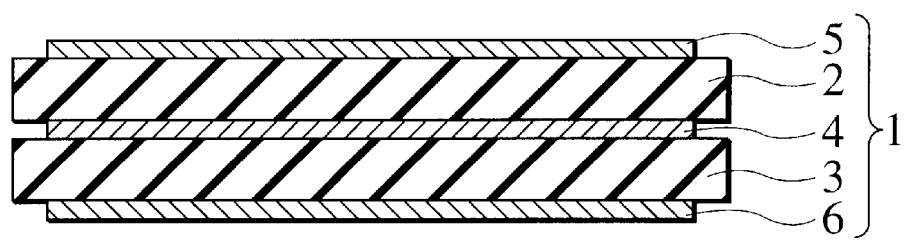
FIG. 2A is a sectional view showing an insulating substrate according to a first embodiment of the present invention.

FIG. 2A is a sectional view showing an insulating substrate 1 according to the first embodiment of the present invention. The substrate 1 consists of at least insulative ceramic layers 2 and 3, an intermediate layer 4 arranged between the ceramic layers 2 and 3 to join them together, a first conductive layer 5 joined to the top surface of the top ceramic layer 2, and a second conductive layer 6 joined to the bottom surface of the bottom ceramic layer 3. The intermediate layer 4 is made of a material that is different from a material of the ceramic layers 2 and 3. The conductive layers 5 and 6 are made of copper and are joined to the ceramic layers 2 and 3, respectively, by direct bonding copper method.

Figure 2B:
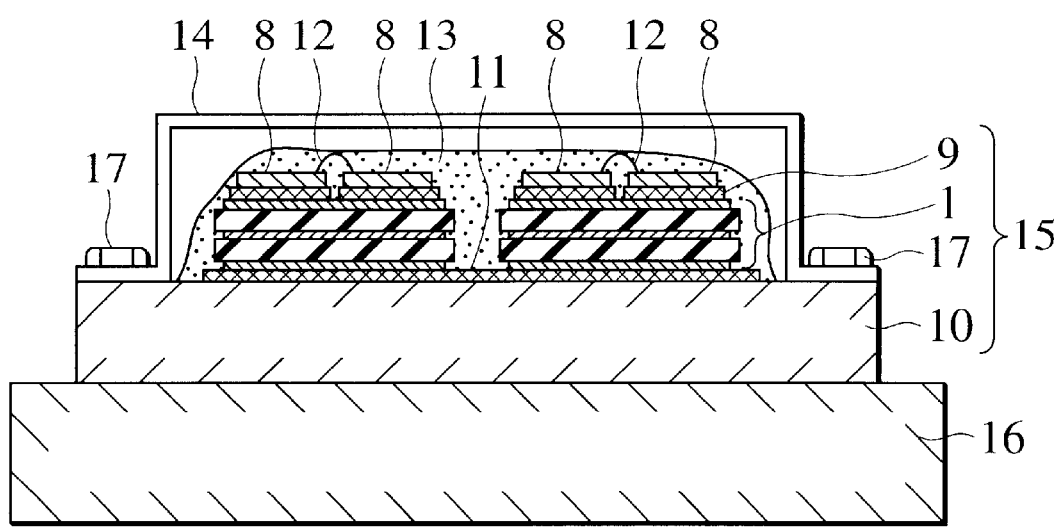
FIG. 2B is a sectional view showing a module semiconductor device according to the first embodiment.

FIG. 2B is a sectional view showing a module semiconductor device 15 according to the first embodiment of the present invention. The device 15 consists of at least one or more semiconductor chips 8, an insulating substrate 1 to which the semiconductor chips 8 are joined, and a base 10 to which the substrate 1 is joined. The semiconductor chips 8 are connected to one another and to external terminals through bonding wires 12.

The device 15 has a solder layer 9 for joining the semiconductor chips 8 to the top surface of the substrate 1, a solder layer 11 for joining the bottom surface of the substrate 1 to the base 10, insulative sealing resin 13 for sealing the semiconductor chips 8, solder layers 9 and 11, and substrate 1, and an insulative resin case 14.

The base 10 is fixed to a water- or air-cooled heat sink 16 with bolts 17. Heat generated by the semiconductor chips 8 is dissipated to the heat sink 16 through the substrate 1 and base 10.

According to the first embodiment, each of the ceramic layers 2 and 3 is an aluminum nitride layer of 1 mm thick. The intermediate layer 4 for joining the ceramic layers 2 and 3 together is a copper layer of 0.3 mm thick. The ceramic layers 2 and 3 and intermediate layer 4 are joined together by direct bonding copper method.

Although the first embodiment employs the two insulative ceramic layers 2 and 3, the number of insulative ceramic layers is optional, for example 3 or more, as will be explained with reference to an eighth embodiment of the present invention.

The inventors of the present invention made tests on module semiconductor devices each having an insulating substrate made of one or more insulative ceramic layers. The tests were made by energizing each device so that semiconductor chips on the device generated heat to cause thermal stress on the substrate. Thereafter, each device was cooled to a room temperature, and a voltage of 10 kV was applied to the device. When energized each device, current was gradually increased to increase thermal stress on the substrate step by step. FIG. 3 is a table showing results of the tests. This table shows the number of module semiconductor devices that showed a dielectric breakdown in the tests with respect to different temperature differences ($\Delta$ T) between energization and de-energization. Comparison tests were made on module semiconductor devices having a conventional insulating substrate made of a single aluminum nitride layer of 2 mm thick serving as an insulative ceramic layer, as well as on module semiconductor devices having an insulating substrate made of three aluminum nitride layers of 0.7 mm thick each. It is understood from FIG. 3 that the module semiconductor devices employing the conventional single-layer insulating substrate gradually increase the number of test pieces that shows a dielectric breakdown as the temperature difference ($\Delta$ T) increases. At $\Delta$ T=200° C., the conventional devices involve 17 dielectric breakdown incidents per 100 test pieces. Each of the test pieces that showed a dielectric breakdown had a through crack from the top to bottom of the aluminum nitride layer. This indicates that a dielectric breakdown of a module semiconductor device is caused by a crack of an aluminum nitride layer serving as an insulative ceramic layer of an insulating substrate of the device. On the other hand, the module semiconductor devices employing two aluminum nitride layers for an insulating substrate involve only one dielectric breakdown in 100 test pieces at $\Delta$ T=200 ° C. The module semiconductor devices employing three aluminum nitride layers for an insulating substrate involve no dielectric breakdown at $\Delta$ T=200° C. It is understood from these results that multiple aluminum nitride layers are effective to prevent dielectric breakdowns. After examining the insulating substrates of the tested devices, it was found that some test pieces having two or three aluminum nitride layers that caused no dielectric breakdown involved a crack in one of the aluminum nitride layers. This verifies that a module semiconductor device having multiple aluminum nitride layers for an insulating substrate secures a required breakdown voltage even if one of the aluminum nitride layers causes cracks.

(Second Embodiment)

The second embodiment of the present invention relates to materials to form insulative ceramic layers of insulating substrates of the present invention. The materials for insulative ceramic layers include those having a high breakdown voltage and those having proper thermal conductivity to cool semiconductor chips. FIG. 4 shows typical ceramic materials including metal oxides such as aluminum oxide ($Al_2O_3$), silicon oxide ($SiO_2$), zirconium oxide ($ZrO_2$), and a compound of silicon oxide and zirconium oxide, metal nitrides such as boron nitride (BN), silicon nitride ($Si_3N_4$), and aluminum nitride (AlN), metal carbides such as silicon carbide (SiC), titanium carbide (TiC), tungsten carbide (WC), and zirconium carbide (ZrC), and metal borides such as lanthanum boride ($LaB_6$), titanium boride ($TiB_2$), and zirconium boride ($ZrB_2$), and their thermal conductivity values and specific resistance values. In terms of the specific resistance values of FIG. 4, a material selected from the group consisting of metal oxides and metal nitrides is suitable for forming an insulative ceramic layer. In additional consideration of the thermal conductivity values of FIG. 4, the aluminum oxide ($Al_2O_3$) and metal nitrides are suitable for insulative ceramic layers. In particular, the aluminum nitride (AlN) has proper specific resistance and thermal conductivity although its strength is low, and therefore, is most suitable for module semiconductor devices that realize large breakdown strength and large control current.

(Third Embodiment)

The third embodiment of the present invention relates to metal materials suitable for forming the intermediate layer 4 of the insulating substrate 1 (FIGS. 2A and 2B) of the present invention. To select metal for the intermediate layer 4, the inventors made tests on module semiconductor devices having an insulating substrate made of two insulative ceramic layers like FIG. 2A with intermediate layers 4 made of different materials. The tests were made basically in the same manner as the first embodiment. The intermediate layers 4 were made from copper (Cu), tungsten (W), and niobium (Nb) and had each a thickness of about 0.3 mm. The two ceramic layers (aluminum nitride layers) 2 and 3 which the intermediate layer 4 joined together had each a thickness of 1 mm. First and second conductive layers 5 and 6 of copper were formed on the top and bottom surfaces of the ceramic layers 2 and 3, respectively, like the first embodiment. FIG. 5 shows results of the tests. The intermediate layers made of copper showed no dielectric breakdown. The intermediate layers made of tungsten showed dielectric breakdowns for large temperature differences ($\Delta$ T). The intermediate layers made of niobium showed dielectric breakdowns even for small temperature differences ($\Delta$ T) and were found to be improper for making the intermediate layers.

The materials were analyzed for thermal stress. The thermal expansion coefficient of copper greatly differs from that of aluminum nitrides but has very low yield strength to cause small thermal stress on the aluminum nitride layers 2 and 3. Accordingly, copper is suitable for making the intermediate layer 4. In addition to copper, aluminum, silver, gold, etc., are also suitable. Although tungsten has large yield strength, it causes no large thermal stress. This is because the thermal expansion coefficient of tungsten is close to that of aluminum nitride, and therefore, is suitable for making the intermediate layer 4. In addition to tungsten, molybdenum is also suitable. The yield strength and thermal expansion coefficient of niobium are between those of copper and those of tungsten, and therefore, niobium is not suitable for making the intermediate layer 4.

Consequently, materials suitable for making the intermediate layer 4 are those having very low yield strength compared with that of the ceramic layers 2 and 3, or those whose thermal expansion coefficient is very close to that of the ceramic layers 2 and 3. According to thermal stress analyses, materials having yield strength that is half or lower the fracture strength of a material of the ceramic layers 2 and 3 are preferable, and materials having a thermal expansion coefficient in the range of $\pm 2\times 10^{-6}$/K of the fracture strength of a material of the ceramic layers 2 and 3 are also preferable.

(Fourth Embodiment)

The fourth embodiment of the present invention employs a ceramic material for making the intermediate layer 4 of the insulating substrate 1 (FIGS. 2A and 2B) of the present invention. The inventors made tests on insulating substrates each consisting of two insulating ceramic layers with the intermediate layer 4 made of various ceramic materials. The tests were carried out in the same manner as the first embodiment.

Similar to the test results of FIG. 5, ceramic materials whose thermal expansion coefficients are close to that of the insulative ceramic layers 2 and 3 showed excellent thermal cycle characteristics when used to form intermediate layers for insulating substrates. According to thermal stress analyses, ceramic materials suitable for making intermediate layers are those having thermal expansion coefficients within the range of $\pm 2\times 10^{-6}$ of that of the insulative ceramic layers 2 and 3.

(Fifth Embodiment)

The fifth embodiment of the present invention relates to materials suitable for making the first and second conductive layers 5 and 6 of the insulating substrate 1 (FIGS. 2A and 2B) of the present invention. Due to the same reason as for the intermediate layer 4, the conductive layers 5 and 6 joined to the top and bottom surfaces of the insulating substrate 1 may be made each of a conductive metal film having low yield stress not to cause large thermal stress on the insulative ceramic layers 2 and 3, or a metal or ceramic material whose thermal expansion coefficient is close to that of the ceramic layers 2 and 3. If the conductive layers 5 and 6 are made of refractory metal or ceramic material, a special process is needed when soldering method the semiconductor chips 8 and base 10 of FIG. 2B to the conductive layers 5 and 6, respectively. In this case, the strength of the joined layers is not always strong. Proper materials for making the conductive layers 5 and 6 may include copper, aluminum, silver, and gold that have good soldering method properties and low yield strength. In terms of material costs, copper and aluminum are proper.

(Sixth Embodiment)

Figure 6A:
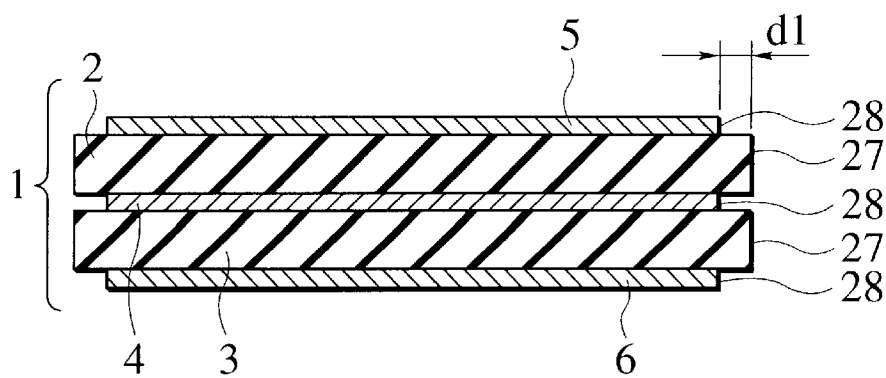
FIG. 6A is a sectional view showing an edge distance (d1) of an insulating substrate.

The sixth embodiment of the present invention relates to a technique of improving the breakdown voltage of an insulating substrate. FIG. 6A is a sectional view showing a creepage surface of an insulating substrate according to the present invention. The creepage surface extends from any one of end faces 28 of an intermediate layer 4 and first and second conductive layers 5 and 6 to a corresponding end face 27 of insulative ceramic layers 2 and 3. A multilayer structure of the ceramic layers 2 and 3 greatly improves the breakdown strength of the insulating substrate 1 except for the creepage surface. To improve the breakdown strength of the creepage surface, the inventors made breakdown tests by varying an edge distance (d1) between the side faces 27 and 28.

Figure 6B:
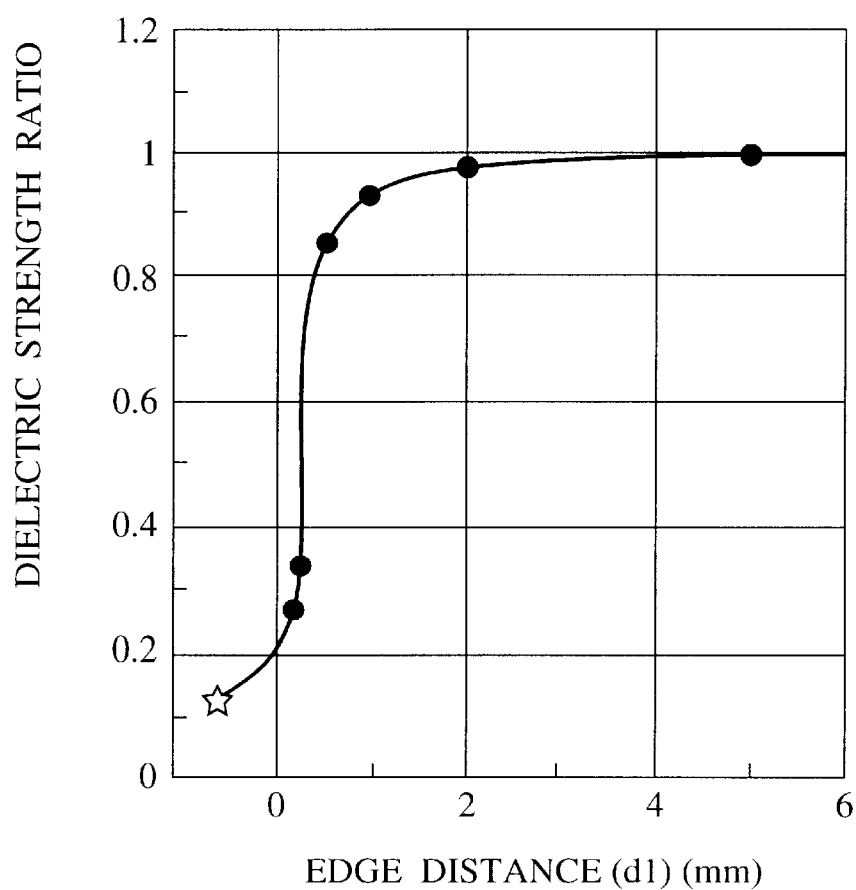
FIG. 6B is a graph showing relationships between edge distances (d1) and dielectric strength ratios and indicating proper edge distances according to a sixth embodiment of the present invention.

FIG. 6B is a graph showing results of the tests. In the graph, a breakdown voltage for an edge distance (d1) of 5 mm is set to be 1 (10 kV), and breakdown voltages were measured for various edge distances (d1). As the edge distance (d1) increases, the breakdown voltage increases. However, it saturates when the edge distance (d1) exceeds 2 mm. It is said, therefore, that increasing the edge distance (d1) is effective to improve a breakdown voltage at a creepage surface. This, however, results in increasing the size of a module semiconductor device, and therefore, it is not preferable to excessively increase the edge distance (d1). If the edge distance (d1) is 0.5 mm, a breakdown voltage at a creepage surface will be allowable. However, in terms of reliability, a proper edge distance (d1) is 1.0 mm or greater.

If the intermediate layer 4 and conductive layers 5 and 6 are larger than the insulative ceramic layers 2 and 3, i.e., if the edge distance (d1) is negative in FIG. 6A, a breakdown voltage at a creepage surface extremely deteriorates as indicated with a star mark in FIG. 6B. Accordingly, it is important to make the ceramic layers 2 and 3 larger than the metal layers including the intermediate layer 4 and conductive layers 5 and 6.

According to tests made by the inventors, aluminum nitride hydrolytically reacts with moisture in air to deteriorate a breakdown voltage at a creepage surface. It is effective, therefore, to cover any part of insulative ceramic layers that is exposed to atmosphere with insulative material that blocks moisture. If the insulative ceramic layers are made of aluminum nitride, it is effective to oxidize any part of the insulative ceramic layers that is exposed to atmosphere to form an aluminum oxide film.

(Seventh Embodiment)

Figure 7A:
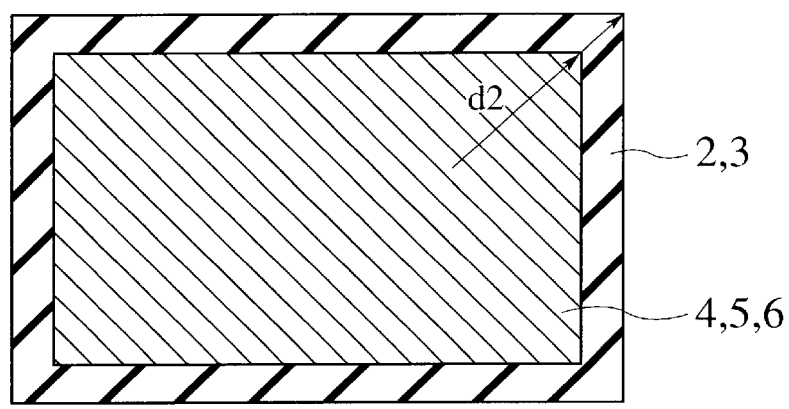
FIG. 7A is a plan view showing a radius (d2) of curvature at a corner of an insulating substrate.

The seventh embodiment of the present invention relates to a technique of further improving a breakdown voltage at a creepage surface of an insulating substrate. FIG. 7A is a plan view showing the insulating substrate 1 of FIG. 2A. A breakdown voltage at a creepage surface is dependent on an edge distance (d1) between an end face of any one of the insulative ceramic layers 2 and 3 and a corresponding end face of the intermediate layer 4 and first and second conductive layers 5 and 6, as well as the shape of each corner of the insulative ceramic layers 2 and 3, intermediate layer 4, and conductive layers 5 and 6. The inventors made breakdown tests on insulating substrates having various radiuses (d2) of curvature at corners.

Figure 7B:
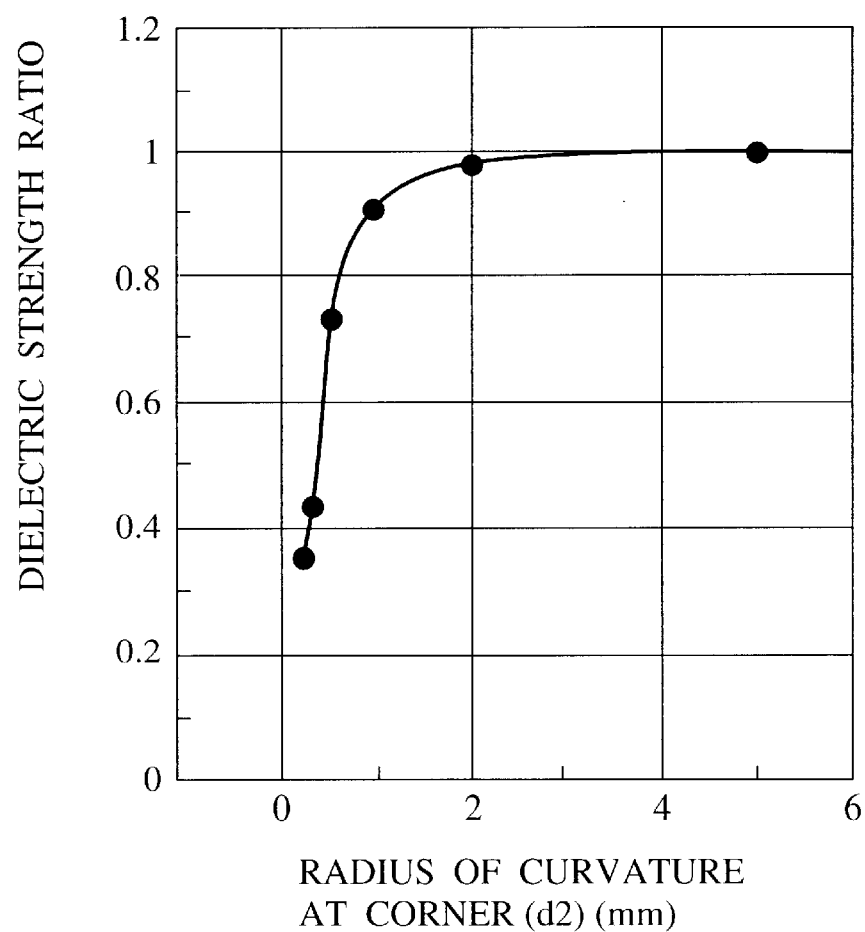
FIG. 7B is a graph showing relationships between corner radiuses (d2) and dielectric strength ratios and indicating proper corner radiuses according to a seventh embodiment of the present invention.

FIG. 7B is a graph showing results of the tests. In the graph, a dielectric breakdown voltage for a corner having a radius of curvature (d2) of 5 mm is set to be 1 (10 kV), and measured breakdown voltages for various radiuses (d2) of curvature are shown. As the radius of curvature (d2) at a corner of the insulative ceramic layers 2 and 3, intermediate layer 4, and first and second conductive layers 5 and 6 increases, a breakdown voltage at a creepage surface increases and saturates when the radius (d2) of curvature exceeds 2 mm. To improve the breakdown voltage of a creepage surface, increasing the radius (d2) of curvature of each corner is effective.

If the radius (d2) of curvature of a corner is 0.5 mm or larger, the breakdown voltage of a creepage surface is satisfactory. In consideration of data fluctuations and to secure reliability, the radius (d2) of curvature of a corner may be 1.0 mm or larger.

Due to electric field concentration, the influence of the shape of a corner on a breakdown voltage is greater in metal layers including the intermediate layer 4 and first and second conductive layers 5 and 6 than in the ceramic layers 2 and 3. Accordingly, it is preferable to shape the corners of at least the intermediate layer 4 and conductive layers 5 and 6 as mentioned above.

(Eighth Embodiment)

Figure 8A:
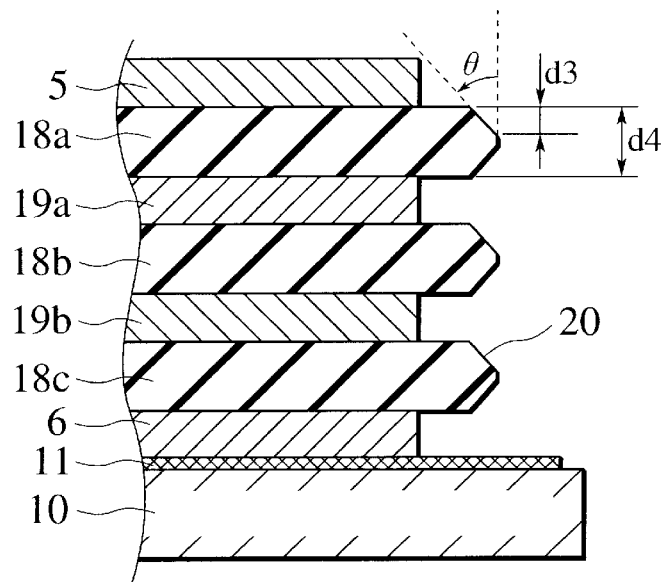
FIG. 8A is a sectional view showing a processed creepage surface of an insulating substrate according to an eighth embodiment of the present invention.

The eighth embodiment of the present invention relates to a technique of further improving a breakdown voltage at a creepage surface of an insulating substrate. FIG. 8A is a sectional view showing a creepage surface of an insulating substrate 30 having three insulative ceramic layers 18a, 18b, and 18c. An edge of each of the ceramic layers 18a, 18b, and 18c is chamfered as indicated with 20 to improve a breakdown voltage at the creepage surface. The larger the size (d3) of the chamfered part 20, the greater the breakdown voltage of the creepage surface. A proper size of the chamfered part 20 is ⅕, preferably, ⅓ of the thickness (d4) of a corresponding one of the ceramic layers 18a, 18b, and 18c. An angle (θ) of the chamfered part 20 is preferably within the range of 30 to 60 degrees, more preferably at 45 degrees as shown in FIG. 8A, with respect to a vertical of the insulating substrate.

(Ninth Embodiment)

Figure 8B:
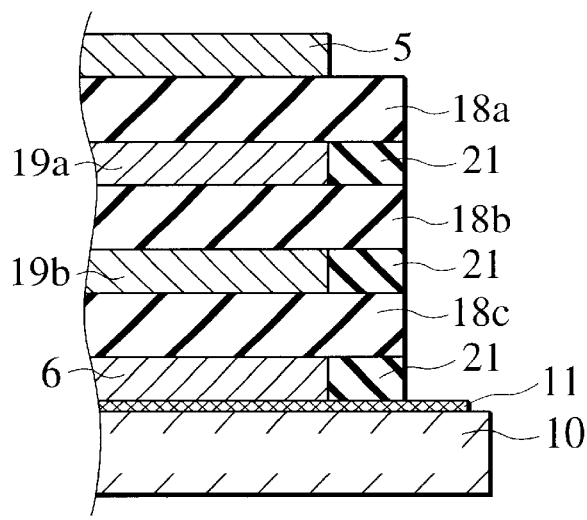
FIG. 8B is a sectional view showing an insulator inserted into each gap between insulative ceramic layers along a creepage surface of an insulating substrate according to a ninth embodiment of the present invention.

FIG. 8B is a sectional view showing a creepage surface of an insulating substrate 30 having three insulative ceramic layers 18a, 18b, and 18c. The ninth embodiment further improves a breakdown voltage at a creepage surface of an insulating substrate by inserting an insulator 21 into each gap among the ceramic layers 18a, 18b, and 18c of the insulating substrate 30. To easily fill the gaps among the ceramic layers 18a, 18b, and 18c with an insulator, the insulator 21 may be thermosetting resin such as epoxy resin that is liquid when injecting and is solid after injected into a required shape.

Figure 8C:
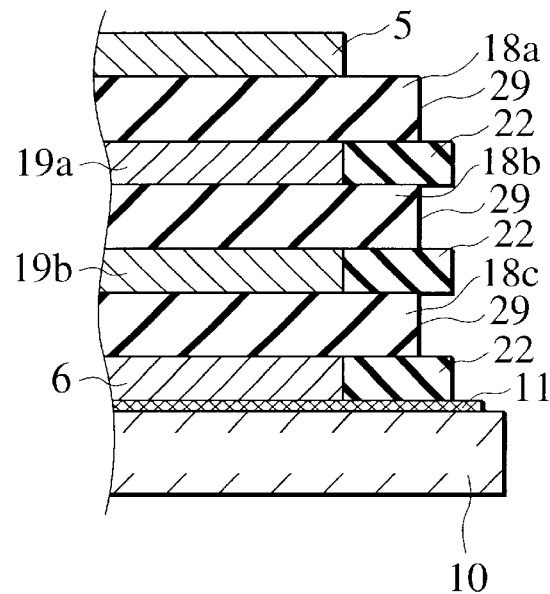
FIG. 8C is a sectional view showing another insulator inserted into each gap between insulative ceramic layers along a creepage surface of an insulating substrate according to a modification of the ninth embodiment.

As shown in FIG. 8C, each end face of an insulator 22 inserted into each gap among insulative ceramic layers 18a, 18b, and 18c of an insulating substrate 30 may be extended outside an end face 29 of each ceramic layer, to further improve the breakdown voltage of a creepage surface of the substrate 30.

(10th Embodiment)

Figure 9:
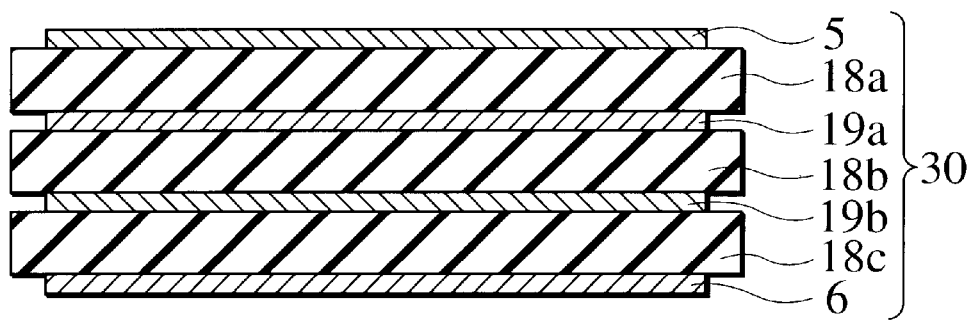
FIG. 9 is a sectional view showing an insulating substrate consisting of three insulative ceramic layers according to a 10th embodiment of the present invention.

The 10th embodiment of the present invention relates to a method of reinforcing the strength of an insulating substrate. FIG. 9 is a sectional view showing an insulating substrate 30 having three insulative ceramic layers 18a, 18b, and 18c. When thermal stress occurs to deform a module semiconductor device employing the substrate 30, the top ceramic layer 18a or the bottom ceramic layer 18c receives highest stress. To cope with this phenomenon, the 10th embodiment forms the top and bottom ceramic layers 18a and 18c from an insulative ceramic material such as aluminum oxide having higher fracture toughness and strength than aluminum nitride, thereby reinforcing the strength of the substrate 30. An improvement in the strength of the ceramic layers 18a and 18c may allow to thin the layers 18a and 18c, to suppress an increase in thermal resistance. Although the 10th embodiment employs the three insulative ceramic layers 18a to 18c, the present invention is applicable to insulating substrates having two and four or more insulative ceramic layers.

(11th Embodiment)

Figure 10:
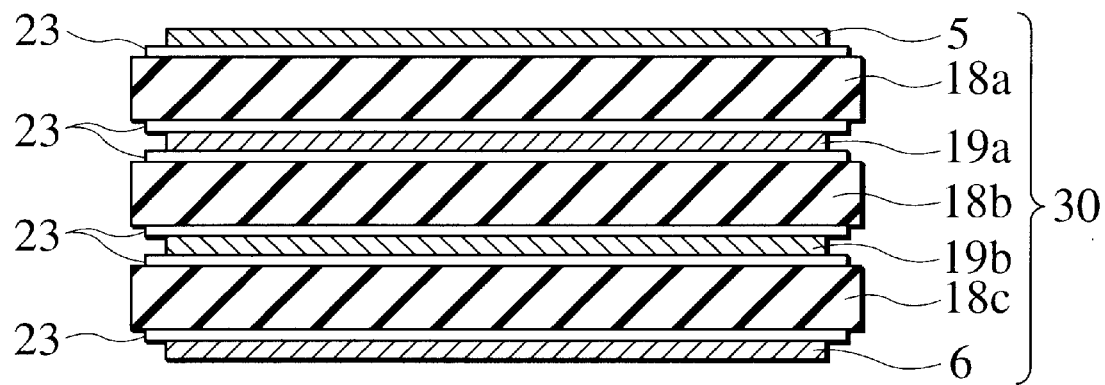
FIG. 10 is a sectional view showing an insulating substrate formed by soldering method method according to an 11th embodiment of the present invention.

The 11th embodiment relates to a method of manufacturing an insulating substrate, in particular, an insulating substrate 30 consisting of three insulative ceramic layers 18a, 18b, and 18c of FIG. 10. The ceramic layers 18a to 18c, intermediate layers 19a and 19b, and first and second conductive layers 5 and 6 are joined together by soldering method, active metal brazing method, direct bonding copper method, or else, to easily form the insulating substrate 30.

The soldering method is carried out by inserting a solder sheet between joining surfaces of material layers and by heat-treating the solder sheet at 250° C. to 350° C. to melt the solder sheet and join the material layers together. The active metal brazing method is carried out by inserting an active metal brazing material containing silver, copper, or titanium between material layers to be joined together like the soldering method and by heat-treating them at 800° C. to 900° C. to melt the brazing material and join the material layers together. The direct bonding copper method is carried out by heating copper at joining surfaces of material layers to a temperature between the melting point (1083° C.) of copper and an eutectic temperature (1065° C.) of copper and copper monoxide and by joining the material layers together with a liquid copper oxide eutectic compound as a jointing material. If the intermediate layers or conductive layers of an insulating substrate are made of copper and the insulative ceramic layers thereof are made of aluminum nitride, a copper monoxide film of about 10 um thick is formed on each joining surface of the intermediate layers and an aluminum oxide ($Al_2O_4$) film of 10 mm thick on each joining surface of the ceramic layers to serve as joining layers.

The inventors carried out thermal cycle tests on insulating substrates formed by soldering method, active metal brazing method, and direct bonding copper method and observed sectional structures thereof.

The insulating substrates joined by soldering method showed good joint conditions with little defects such as voids. Each solder layer 23 (FIG. 10) has low fatigue strength, and therefore, may cause a crack if a large temperature difference occurs during thermal cycles. Accordingly, the soldering method is improper for module semiconductor devices for severe temperature conditions.

The insulating substrates joined by active metal brazing showed good joint conditions with little defects such as voids, like those by soldering method. Each layer of active metal brazing material has low fracture toughness, and therefore, may cause a crack if thermal cycles involve a large temperature difference. Accordingly, the active metal brazing method is improper for module semiconductor devices for severe temperature conditions.

Compared with the soldering method and active metal brazing method, the direct bonding copper method produces a small quantity of liquid when joining material layers together, and therefore, the insulating substrates joined by direct bonding copper method include many voids in each joint interface. However, the insulative ceramic layers 18a to 18c, intermediate layers 19a and 19b, first and second conductive layers 5 and 6, and copper layers of each insulating substrate joined by direct bonding copper method showed no cracks during thermal cycle tests. Consequently, it is said that the direct bonding copper method is the best among these three joining techniques. The voids observed in each joint interface made by direct bonding copper method may be reduced by flatly finishing the surface of each material layer before joining them together.

(12th Embodiment)

Figure 11A:
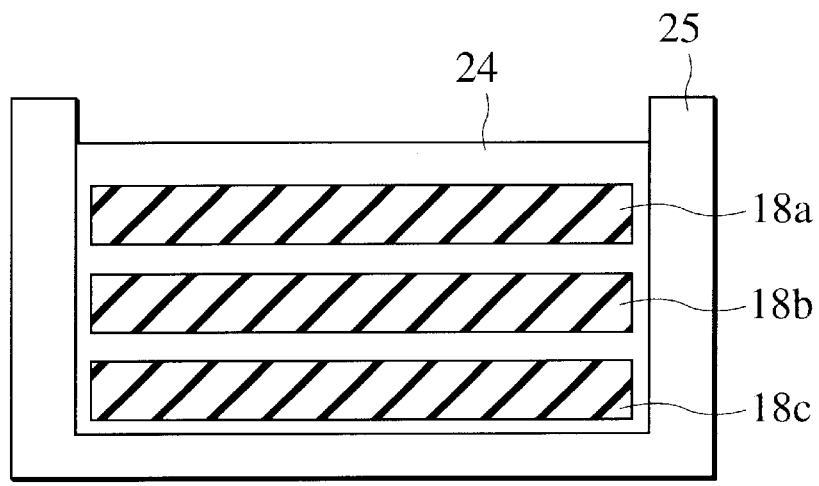
FIGS. 11A to 11C are sectional views showing a method of manufacturing an insulating substrate according to a 12th embodiment of the present invention.
Figure 11B:
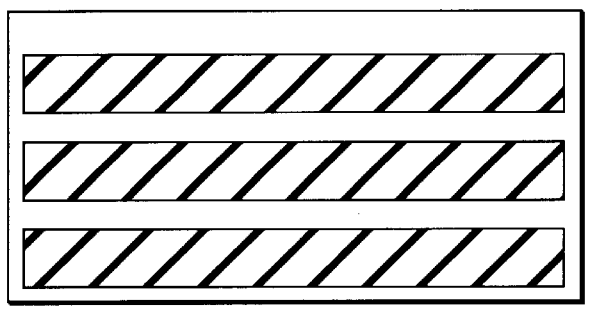
Figure 11C:
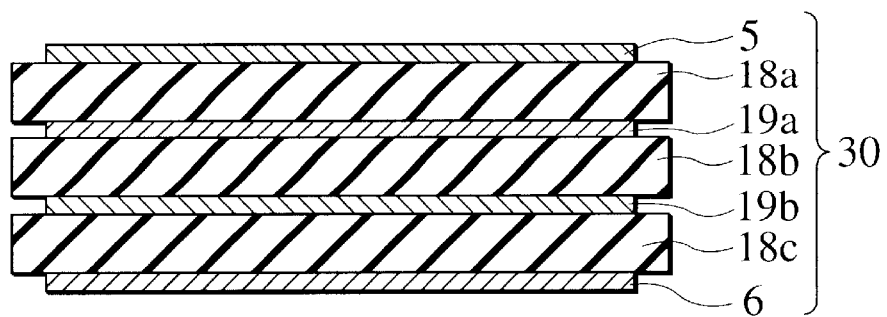

The joining techniques explained in the 11th embodiment have some problems in connection with productivity and resistance to thermal cycles. The 12th embodiment provides a method of manufacturing an insulating substrate that overcomes the problems. FIGS. 11A to 11C are sectional views showing the manufacturing method of the 12th embodiment.

(1) In FIG. 11A, insulative ceramic layers 18a, 18b, and 18c are fixed at predetermined intervals in a forging die 25. Molten metal 24 is introduced into the die 25, to forge intermediate layers, a first conductive layer, and a second conductive layer. At this time, the ceramic layers 18a to 18c are sufficiently preheated to prevent large thermal stress. The metal 24 may be copper or aluminum that is suitable for making the intermediate and conductive layers.

(2) In FIG. 11B, the ceramic layers 18a to 18c and metal 24 are taken out of the die 25. The forged metal 24 serving as the intermediate and conductive layers is solidified to surround the ceramic layers 18a to 18c.

(3) In FIG. 11C, extra metal is removed by machining, electrolytic etching, etc., from the metal 24, to complete an insulating substrate 30 having the ceramic layers 18a to 18c, intermediate layers 19a and 19b, and conductive layers 5 and 6.

The method of the 12th embodiment involves no joining layers (solder or brazing metal layers) 23 of FIG. 10 that may cause a strength problem. Accordingly, the insulating substrate formed by the method of the 12th embodiment shows proper resistance to thermal cycles. Compared with the direct bonding copper method, the method of the 12th embodiment involves a large quantity of liquid in a joining (forging) stage, to reduce defects such as voids in each joint interface and improve the joint strength of the insulating substrate.

(13th Embodiment)

The manufacturing method of the 11th embodiment may cause a warp between an insulative ceramic layer and an intermediate layer or a conductive layer. Namely, the 11th embodiment has some difficulty in maintaining a flat joint interface and may cause a gap between surfaces that are joined together. The gap deteriorates joint strength, decreases a breakdown voltage, and causes stress concentration. To solve this, the 13th embodiment provides a method of manufacturing an insulating substrate having double intermediate layers to prevent a warp or gap.

Figure 12:
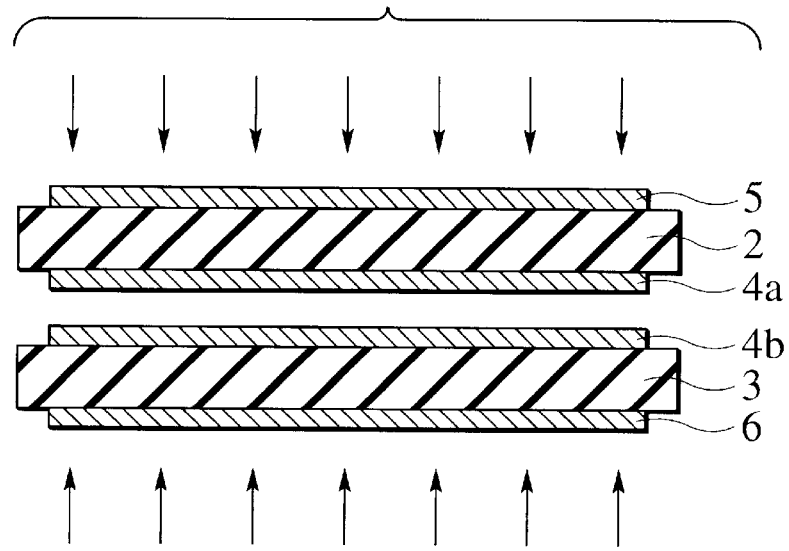
FIG. 12 is a sectional view showing a method of manufacturing an insulating substrate according to a 13th embodiment of the present invention.

FIG. 12 is a sectional view showing the manufacturing method of the 13th embodiment. An insulative ceramic layer 2 is provided with copper layers 4a and 5, and an insulative ceramic layer 3 is provided with copper layers 4b and 6. The copper layers 4a and 4b are joined to each other by soldering method, active metal brazing method, or direct bonding copper method explained in the 11th embodiment, to form an insulating substrate.

According to the 13th embodiment, the joined surfaces of the copper layers 4a and 4b are made of a single material, i.e., copper, to prevent the formation of a gap. As a result, the insulating substrate made by the method of the 13th embodiment has high joint strength.

Although the 13th embodiment joins two insulating substrates to form a two-layer insulating substrate, the method of the 13th embodiment is applicable to form an insulating substrate having three or more layers.

(14th Embodiment)

Figure 13:
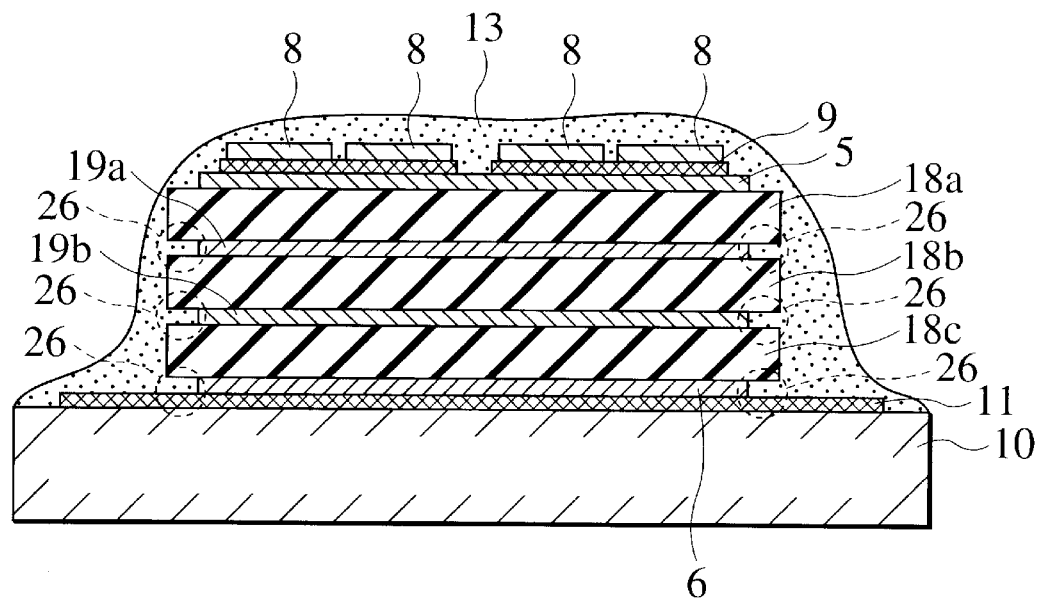
FIG. 13 is a sectional view showing a module semiconductor device according to a 14th embodiment of the present invention.

The 14th embodiment of the present invention provides a module semiconductor device employing an insulating substrate of any one of the embodiments mentioned above. FIG. 13 is a sectional view showing a module semiconductor device employing an insulating substrate 30 made of three insulative ceramic layers 18a, 18b, and 18c, according to the 14th embodiment.

More precisely, the module semiconductor device consists of the insulative ceramic layers 18a to 18c, intermediate layers 19a and 19b each arranged between corresponding ones of the ceramic layers 18a to 18c to join them together, a first conductive layer 5 joined to the top surface of the top ceramic layer 18a, a second conductive layer 6 joined to the bottom surface of the bottom ceramic layer 18c, semiconductor chips 8 joined to the top surface of the first conductive layer 5, and a base 10 joined to the bottom surface of the second conductive layer 6. The base 10 is made of metal, ceramics, or a composite material thereof.

Even if any one of the ceramic layers 18a to 18c has strength lower than design strength and causes a breakage due to, for example, thermal stress, the remaining ceramic layers are sound to cause no dielectric breakdown in the insulating substrate. Namely, the module semiconductor device of the 14th embodiment is capable of continuously maintaining proper operation even if a breakage occurs in any one of the ceramic layers thereof.

Generally, semiconductor chips and an insulating substrate of a module semiconductor device are sealed with insulative sealing resin such as silicon gel to improve a breakdown voltage at a creepage surface of the insulating substrate. For the module semiconductor device of FIG. 13, the present invention impregnates each gap 26 among the ceramic layers 18a to 18c with insulative sealing resin 13, to further improve the breakdown strength of a creepage surface of the insulating substrate 30. The resin 13 may be silicon gel, epoxy-based resin, or else. The resin impregnation may be carried out in a vacuum or a pressure reduced atmosphere.

(15th Embodiment)

Figure 14:
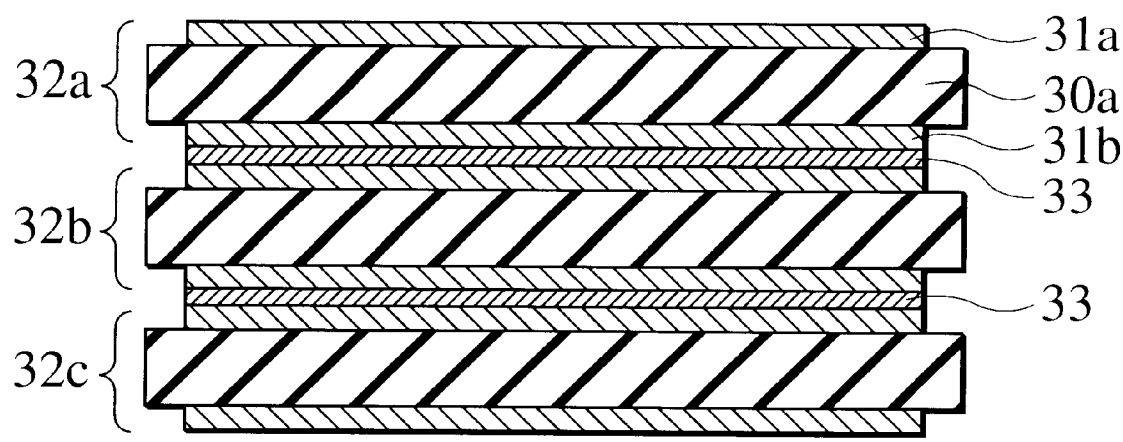
FIG. 14 is a sectional view showing a method of manufacturing an insulating substrate according to a 15th embodiment of the present invention.

The insulating substrates of the embodiments mentioned above have different structures from those of the prior arts. Namely, the insulating substrates of the present invention are each made of a plurality of insulative ceramic layers. As a result, the insulating substrates of the present invention may need a separate manufacturing line when manufactured. This may cause some difficulties in terms of productivity and costs. To cope with this, the 15th embodiment shown in FIG. 14 provides another manufacturing method. The 15th embodiment lays insulating substrates 32a, 32b, and 32c one upon another. Each of these substrates is of the prior art consisting of an insulative ceramic layer 30a and conductive layers 31a and 31b that are joined to the top and bottom surfaces of the ceramic layer 30a. Adjacent ones of the substrates 32a to 32c are joined to each other with a conductive joint layer 33, to form an integrated insulating substrate. These manufacturing processes are carried out through a conventional manufacturing line without modification.

The insulating substrates 32a to 32c may be joined together by active metal brazing method, soldering method, or direct bonding copper method depending on application. The active metal brazing method may be employed when high strength is needed at each joint. The soldering method may be employed when thermal stress must be reduced during manufacturing. The direct bonding copper method may be employed when high thermal fatigue strength is needed at each joint.

If high strength is not needed at each joint, a binding material selected from paste and organic resin containing heat-conducting components such as metal and ceramics to improve thermal conductivity may be used instead of the above-mentioned joining techniques. Employing the binding material greatly reduces the manufacturing costs of insulating substrates.

In this way, the 15th embodiment employs a conventional insulating-substrate-manufacturing line as it is to fabricate insulating substrates of high reliability at low costs.

What is claimed is:

1. An insulating substrate comprising:
   insulative ceramic layers having shapes which are substantially identical to each other, laid one upon another;
   an intermediate layer arranged between adjacent ones of the ceramic layers to join the adjacent ceramic layers to each other;
   a first conductive layer electrically separated from the intermediate layer, joined to the top surface of a top one of the ceramic layers; and
   a second conductive layer electrically separated from the intermediate layer, joined to the bottom surface of a bottom one of the ceramic layers.

2. The insulating substrate of claim 1, wherein the ceramic layers are made of a material selected from the group consisting of metal oxides and metal nitrides.

3. The insulating substrate of claim 1, wherein the intermediate layer is made of a metal whose yield stress in half the fracture strength of the ceramic layers at the maximum.

4. The insulating substrate of claim 1, wherein the intermediate layer is made of a metal whose thermal expansion coefficient is within the range of $\pm 2 \times 10^{-6}$/K of that of the ceramic layers.

5. The insulating substrate of claim 1, wherein the intermediate layer is made of a ceramic material whose thermal expansion coefficient is within the range of $\pm 2 \times 10^{-6}$/K of that of the ceramic layers.

6. The insulating substrate of claim 1, wherein the first and second conductive layers are made of a maternal selected from the group consisting of copper, aluminum, and alloys of copper and aluminum.

7. The insulating substrate of claim 1, wherein end faces of the ceramic layers are protruded from corresponding end faces of the first and second conductive layers and the intermediate layer by at least 0.5 mm.

8. The insulating substrate of claim 1, wherein each corner of the ceramic layers, first and second conductive layers, and the intermediate layer has a radius of curvature of at least 0.5 mm.

9. The insulating substrate of claim 1, wherein each corner of the first and second conductive layers and the intermediate layer has a radius of curvature of at least 0.5 mm.

10. The insulating substrate of claim 1, wherein each edge of the ceramic layers is chamfered at an angle in the range of 30 to 60 degrees with respect to a vertical and a size of at least 1/5 of the thickness of the ceramic layers.

11. The insulating substrate of claim 1, further comprising:
    an insulating material immersed into each gap between adjacent ones of the ceramic layers along a creepage surface area of the insulating substrate.

12. The insulating substrate of claim 11, wherein an end face of the insulating material is protruded from corresponding end faces of the ceramic layers.

13. The insulating substrate of claim 1, wherein an area of the ceramic layers that is exposed to atmosphere is covered with an insulating material to block moisture.

14. The insulating substrate of claim 1, wherein the number of ceramic layers is at least three, and top and bottom ones of the ceramic layers are made of a material whose strength and fracture toughness are higher than those of a material that forms the remaining ceramic layers.

15. A module semiconductor device comprising:
    insulative ceramic layers having shapes which are substantially identical to each other, laid one upon another;
    an intermediate layer arranged between adjacent ones of the ceramic layers to join the adjacent ceramic layers to each other;
    a first conductive layer electrically separated from the intermediate layer, joined to the top surface of a top one of the ceramic layers;
    a second conductive layer electrically separated from the intermediate layer, joined to the bottom surface of a bottom one of the ceramic layers;
    semiconductor chips joined to the top surface of the first conductive layer; and
    a base joined to the bottom surface of the second conductive layer,
    wherein end faces of the ceramic layers are protruded from corresponding end faces of the first and second conductive layers and the intermediate layer.

16. The module semiconductor device of claim 15, further comprising:
    an insulative sealing material immersed into each gap between adjacent ones of the ceramic layers and each gap between the bottom ceramic layer and the base along a creepage surface area of the insulating substrate.

17. An insulating substrate comprising:
    insulative ceramic layers having shapes which are substantially identical to each other, said ceramic layers laid one upon another and made of aluminum nitride;
    an intermediate layer arranged between adjacent ones of the ceramic layers to join the adjacent ceramic layers to each other, said intermediate layer made of a material selected from the group consisting of copper, aluminum, silver, gold, tungsten and molybdenum;
    a first conductive layer electrically separated from the intermediate layer and joined to the top surface of a top one of the ceramic layers, said first conductive layer made of a material selected from the group consisting of copper, aluminum, silver, and gold; and
    a second conductive layer electrically separated from the intermediate layer and joined to the bottom surface of a bottom one of the ceramic layers, said second conductive layer made of a material selected from the group consisting of copper, aluminum, silver, and gold,
    wherein end faces of the ceramic layers are protruded from corresponding end faces of the first and second conductive layers and the intermediate layer.

18. A module semiconductor device comprising:
    insulative ceramic layers having shapes which are substantially identical to each other, said ceramic layer laid one upon another and made of aluminum nitride;
    an intermediate layer arranged between adjacent ones of the ceramic layers to join the adjacent ceramic layers to each other, said intermediate layer made of a material selected from the group consisting of copper, aluminum, silver, gold, tungsten and molybdenum;

a first conductive layer electrically separated from the intermediate layer and joined to the top surface of a top one of the ceramic layers, said first conductive layer made of a material selected from the group consisting of copper, aluminum, silver, and gold;

a second conductive layer electrically separated from the intermediate layer and joined to the bottom surface of a bottom one of the ceramic layers, said second conductive layer made of a material selected from the group consisting of copper, aluminum, silver, and gold;

semiconductor chips joined to the top surface of the first conductive layer; and a base joined to the bottom surface of the second conductive layer, wherein end faces of the ceramic layers are protruded from corresponding end faces of the first and second conductive layers and the intermediate layer.

* * * * *